(12) United States Patent
Cha et al.

(10) Patent No.: US 10,140,176 B2
(45) Date of Patent: Nov. 27, 2018

(54) SEMICONDUCTOR MEMORY DEVICE, MEMORY SYSTEM INCLUDING THE SAME, AND METHOD OF ERROR CORRECTION OF THE SAME

(71) Applicant: Samsung Electronics Co., Ltd., Suwon-si, Gyeonggi-do (KR)

(72) Inventors: Sanguhn Cha, Yongin-si (KR); Hoiju Chung, Yongin-si (KR); Uksong Kang, Seongnam-si (KR); Chulwoo Park, Yongin-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 15/156,804

(22) Filed: May 17, 2016

(65) Prior Publication Data

US 2016/0350181 A1    Dec. 1, 2016

(30) Foreign Application Priority Data

Jun. 1, 2015    (KR) .................. 10-2015-0077401

(51) Int. Cl.
*G11C 29/00* (2006.01)
*G06F 11/10* (2006.01)
(Continued)

(52) U.S. Cl.
CPC .......... *G06F 11/1068* (2013.01); *G11C 29/02* (2013.01); *G11C 29/42* (2013.01); *G11C 29/52* (2013.01); *H03M 13/1575* (2013.01)

(58) Field of Classification Search
None
See application file for complete search history.

(56) References Cited

U.S. PATENT DOCUMENTS

| | | | |
|---|---|---|---|
| 4,358,848 A * | 11/1982 | Patel | ................... G06F 11/1028 714/761 |
| 7,237,176 B2 | 6/2007 | Briggs et al. | |

(Continued)

FOREIGN PATENT DOCUMENTS

KR    20160024472 A    3/2016

*Primary Examiner* — Daniel McMahon
(74) *Attorney, Agent, or Firm* — Harness, Dickey & Pierce, P.L.C.

(57) ABSTRACT

An error correcting method of a semiconductor memory device includes receiving first data from outside the semiconductor memory device. First check bits are generated based on the first data and a first parity generator matrix. The first parity generator matrix includes a plurality of columns of bits. The plurality of columns of bits are arranged in a plurality of parity generator matrix groups. An error correcting code (ECC) code word including a plurality of ECC code word groups is stored in the plurality of memory cell groups. Each of the plurality of ECC code word groups have the first data and the first check bits. The plurality of ECC code word groups correspond to the plurality of parity generator matrix groups, respectively. For each parity generator matrix group of the first parity generator matrix, a result value of a bit-by-bit exclusive OR (XOR) operation performed on any two columns included in the parity generator matrix group is equal to a column number of a column that is not included in the parity generator matrix group. Thus, when a first ECC code word group, from among the plurality of ECC code word groups, includes error bits, a miscorrected bit that would be caused by the error bits as a result of performing an error correction operation on the first ECC code word group is located in an ECC code word group other than the first ECC code word group.

20 Claims, 16 Drawing Sheets

(51) Int. Cl.
*G11C 29/52* (2006.01)
*H03M 13/15* (2006.01)
*G11C 29/02* (2006.01)
*G11C 29/42* (2006.01)

(56) References Cited

U.S. PATENT DOCUMENTS

| | | |
|---|---|---|
| 7,406,651 B2 | 7/2008 | Yoon |
| 7,734,980 B2 | 6/2010 | Alexander et al. |
| 8,230,157 B2 | 7/2012 | Kim et al. |
| 8,527,836 B2 | 9/2013 | Subashchandrabose et al. |
| 8,631,304 B2 | 1/2014 | Lasser |
| 8,635,508 B2 | 1/2014 | Yang et al. |
| 8,677,216 B2 * | 3/2014 | Park ................ G06F 11/1044 714/764 |
| 8,856,608 B2 | 10/2014 | Mumtaz et al. |
| 8,930,647 B1 * | 1/2015 | Smith ................ G06F 9/44557 711/103 |
| 9,231,623 B1 * | 1/2016 | Kumar ............... H03M 13/2963 |
| 9,432,298 B1 * | 8/2016 | Smith ................ H04L 49/9057 |
| 9,569,302 B1 * | 2/2017 | Bellorado ........... G06F 11/1004 |
| 2008/0288853 A1 | 11/2008 | Kong et al. |
| 2011/0161748 A1 * | 6/2011 | Casper ................ G11O 5/02 714/708 |
| 2013/0297989 A1 | 11/2013 | Meir et al. |
| 2014/0122973 A1 | 5/2014 | Motwani |
| 2015/0339062 A1 * | 11/2015 | Toyoda ............... G06F 3/0611 711/118 |
| 2016/0357630 A1 * | 12/2016 | Kang ................ G11O 5/025 |
| 2017/0179980 A1 * | 6/2017 | Lin ................... H03M 13/2963 |

* cited by examiner

SEMICONDUCTOR MEMORY DEVICE, MEMORY SYSTEM INCLUDING THE SAME, AND METHOD OF ERROR CORRECTION OF THE SAME

CROSS-REFERENCE TO RELATED APPLICATION

This application claims priority under 35 U.S.C. § 119 to Korean Patent Application No. 10-2015-0077401 filed on Jun. 1, 2015, the entire contents of which are incorporated herein by reference.

BACKGROUND

Field

At least one example embodiment of the inventive concepts relate to a memory device, and particularly, to a semiconductor memory device capable of correcting an error, a memory system including the semiconductor memory device, and a method of error correction of the same.

Description of Related Art

Semiconductor memory devices may be used to store data, and largely classified as volatile memory devices and nonvolatile memory devices. A volatile memory device may store data using a process of charging and discharging of a capacitor. The volatile semiconductor memory device such as a random access memory (RAM) may store or read data only while power is supplied and may lose the stored data when the power is turned off.

SUMMARY

At least one example embodiment of the inventive concepts provide a semiconductor memory device capable of externally correcting and detecting a miscorrected bit generated in an error correction process and uncorrectable error bits which are out of the error correction ability of an error correction unit.

At least some example embodiments of the inventive concepts provide a method of correcting errors in a semiconductor memory device capable of externally correcting and detecting a miscorrected bit generated in an error correction process and uncorrectable error bits which are out of the error correction ability of an error correction unit.

The technical objectives of at least some example embodiments of the inventive concepts are not limited to the above disclosure; other objectives may become apparent to those of ordinary skill in the art based on the following descriptions.

According to at least some example embodiments of the inventive concepts, a memory system may include a host configured to generate an address signal and a command, and a semiconductor memory device configured to receive the address signal and the command from the host, receive first data from the host and transmit data to the host.

The semiconductor memory device may be configured to generate first check bits based on the first data received from the host, divide an error correcting code (ECC) code word including the first data and the first check bits into a plurality of ECC code word groups, and dispose a miscorrected bit in another ECC code word group rather than a first ECC code word group, the miscorrected bit being caused by error bits included in the first ECC code word group.

In one or more example embodiments of the inventive concepts, the semiconductor memory device may include a first check bit generator and a memory cell array.

The first check bit generator may generate the first check bits based on the first data. The memory cell array may include a plurality of memory cell groups, each of the plurality of memory cell groups including a plurality of memory cells, and stores the first data and the first check bits. The first check bit generator may divide an ECC code word including the first data and the first check bits into the plurality of code word groups, and dispose the miscorrected bit in another ECC code word group rather than the first ECC code word group.

According to at least some example embodiments of the inventive concepts, the semiconductor memory device may further include a second check bit generator, a syndrome bit generator, an error locator, and an error correction circuit.

The second check bit generator may generate second check bits based on second data received from the memory cell array. The syndrome bit generator may generate syndrome bits based on the second check bits and third check bits received from the memory cell array. The error locator may decode the syndrome bits. The error correction circuit may correct the second data based on an output of the error locator.

According to at least some example embodiments of the inventive concepts, a memory system may include a host configured to generate an address signal and a command, and a semiconductor memory device configured to receive the address signal and the command from the host, receive first data from the host and transmit data to the host.

The semiconductor memory device may generate first check bits based on the first data received from the host, divide an error correcting code (ECC) code word including the first data and the first check bits into a plurality of code word groups, divide each of the code word groups into a plurality of code word sub groups, and dispose a miscorrected bit in another ECC code word group rather than a first ECC code word group, if error bits exist only in the first ECC code word sub group of a first ECC code word group, the miscorrected bit being caused by error bits in the first ECC code word sub group of the first ECC code word group.

In one or more example embodiments, the semiconductor memory device may be configured such that if the error bits exist only in the first ECC code word sub group of the first ECC code word group and the miscorrected bit caused by the error bits exist in the first ECC code word sub group, the semiconductor memory device may dispose the miscorrected bit in the first ECC code word sub group.

According to at least some other example embodiments, the semiconductor memory device may be configured such that if the error bits exist in the first ECC code word sub group and a second ECC code word sub group of the first ECC code word group, the semiconductor memory device may dispose a miscorrected bit caused by the error bits in another ECC code word group rather than the first ECC code word group.

According to at least some other example embodiments of the inventive concepts, a method of correcting an error in a semiconductor memory device including a memory cell array which includes a plurality of memory cell groups, each of the plurality of memory cell groups including a plurality of memory cells may include receiving first data from outside the semiconductor memory device; generating first check bits based on the first data so that a miscorrected bit which is caused by error bits included in a first error correcting code (ECC) code word group is disposed in another ECC code word group rather than the first ECC code word group; and storing an ECC code word including a plurality of ECC code word groups each having the first data and the first check bits in the plurality of memory cell groups.

According to one or more example embodiments of the inventive concepts, a method of correcting an error in a semiconductor memory device including a memory cell array which includes a plurality of memory cell groups each including a plurality of memory cells may include receiving first data from outside the semiconductor memory device; generating first check bits based on the first data; storing an error correcting code (ECC) code word including a plurality of ECC code word groups each ECC code word group having a plurality of ECC code word sub groups each having the first data and the first check bits in the plurality of memory cell groups; and disposing a miscorrected bit in a first ECC code word sub group or in another ECC code word group rather than the first ECC code word group when the error bits exist only in the first ECC code word sub group of the first ECC code word group and the miscorrected bit caused by the error bits exist in the first ECC code word sub group.

In one or more example embodiments, when the error bits exist in the first ECC code word sub group and a second ECC code word sub group of the first ECC code word group, the miscorrected bit caused by the error bits may be disposed in another ECC code word group rather than the first ECC code word group.

According to one or more example embodiments of the inventive concepts, a semiconductor memory device may include a first check bit generator configured to generate first check bits based on first data received from outside the semiconductor memory device, and a memory cell array including a plurality of memory cell groups each including a plurality of memory cells, and configured to store the first data and the first check bits.

The first check bit generator may divide an ECC code word including the first data and the first check bits into the plurality of code word groups, and disposes a miscorrected bit caused by error bits included in the first ECC code word group in another ECC code word group rather than the first ECC code word group.

In one or more example embodiments, the semiconductor memory device may further include a second check bit generator, a syndrome bit generator, an error locator, and an error correction circuit.

The second check bit generator may generate second check bits based on second data received from the memory cell array. The syndrome bit generator may generate syndrome bits based on the second check bits and third check bits received from the memory cell array. The error locator may decode the syndrome bits. The error correction circuit may correct the second data based on an output of the error locator.

In one or more example embodiments, the second check bit generator may divide an ECC code word including the second data and the second check bits into the plurality of code word groups, and dispose a miscorrected bit caused by error bits included in a second ECC code word group in another ECC code word group rather than the second ECC code word group.

According to at least some example embodiments, a semiconductor memory device may include an encoder configured to generate first check bits based on data received from a host, form an error correcting code (ECC) code word including the data and the first check bits, divide the ECC code word into a plurality of ECC code word groups, and dispose a miscorrected bit in an ECC code word group, the miscorrected bit being caused by error bits in at least one of the plurality of the ECC code word group; a memory cell array including a plurality of memory cell groups having a plurality of memory cells, and configured to store the ECC code word; a decoder configured to decode and correct a data received from the memory cell array based on second check bits received from the memory cell array, and output the corrected data.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION OF THE EMBODIMENTS

Figure 1:
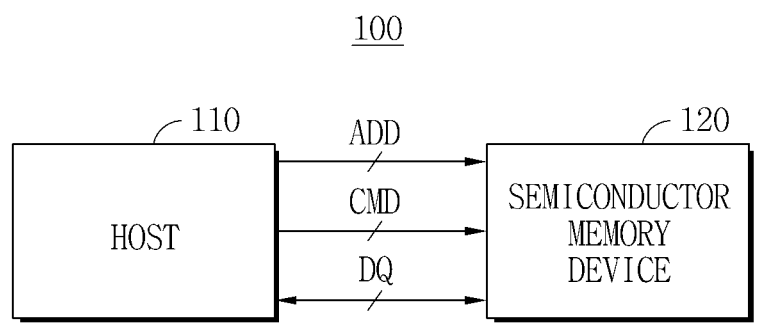
FIG. 1 is a block diagram illustrating a memory system including a semiconductor memory device according to at least one example embodiment of the inventive concepts.

Detailed example embodiments of the inventive concepts are disclosed herein. However, specific structural and functional details disclosed herein are merely representative for purposes of describing example embodiments of the inventive concepts. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments of the inventive concepts are described herein with reference to schematic illustrations of idealized embodiments (and intermediate structures) of the inventive concepts. As such, variations from the shapes of the illustrations as a result, for example, of manufacturing techniques and tolerances, are to be expected. Thus, example embodiments of the inventive concepts should not be construed as limited to the particular shapes of regions illustrated herein but are to include deviations in shapes that result, for example, from manufacturing.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a block diagram illustrating a memory system 100 including a semiconductor memory device according to at least some example embodiments of the inventive concepts.

Referring to FIG. 1, the memory system 100 may include a host 110 and a semiconductor memory device 120.

The host 110 may generate an address signal ADD and a command CMD, and provide the address signal ADD and the command CMD to the semiconductor memory device 120 through buses. Data DQ may be transmitted from the host 110 to the semiconductor memory device 120 through the buses, or transmitted from the semiconductor memory device 120 to the host 110 through the buses. According to at least one example embodiment of the inventive concepts, the host 110 may include or be implemented by one or more circuits or circuitry (e.g., hardware) specifically structured to carry out some or all of the operations described herein as being performed by the host 110 (or an element thereof). According to at least one example embodiment of the inventive concepts, the host 110 may include or be implemented by a memory and one or more processors executing computer-readable code (e.g., software) that is stored in the memory and includes instructions corresponding to some or all of the operations described herein as being performed by the host 110 (or an element thereof). According to at least one example embodiment of the inventive concepts, the host 110 may be implemented by, for example, a combination, of the above-referenced hardware and processors executing computer-readable code.

The semiconductor memory device 120 may include semiconductor memory devices according to at least some example embodiments of the inventive concepts.

Accordingly, with respect to an error correcting code (ECC) code word used, for example, for error checking and correcting, the semiconductor memory device 120 may dispose a miscorrected bit, caused by error bits included in a first error correcting code (ECC) code word group of the ECC code word, in another ECC code word group of the ECC code word, rather than the first ECC code word group. Therefore, the miscorrected bit may be detected outside the semiconductor memory device 120.

Further, when error bits exist only in a first ECC code word sub group of the first ECC code word group, the semiconductor memory device 120 may dispose a miscorrected bit, caused by the error bits in a second ECC code word sub group of the first ECC code word group, in another ECC code word group rather than the first ECC code word group, but is not limited thereto. For example, when the error bits exist in the first ECC code word sub group and the second ECC code word sub group of the first ECC code word group, the semiconductor memory device 120 may dispose the miscorrected bit, caused by the error bits, in another code word group rather than the first ECC code word group. Therefore, the miscorrected bit may be detected outside the semiconductor memory device 120.

Figure 2:
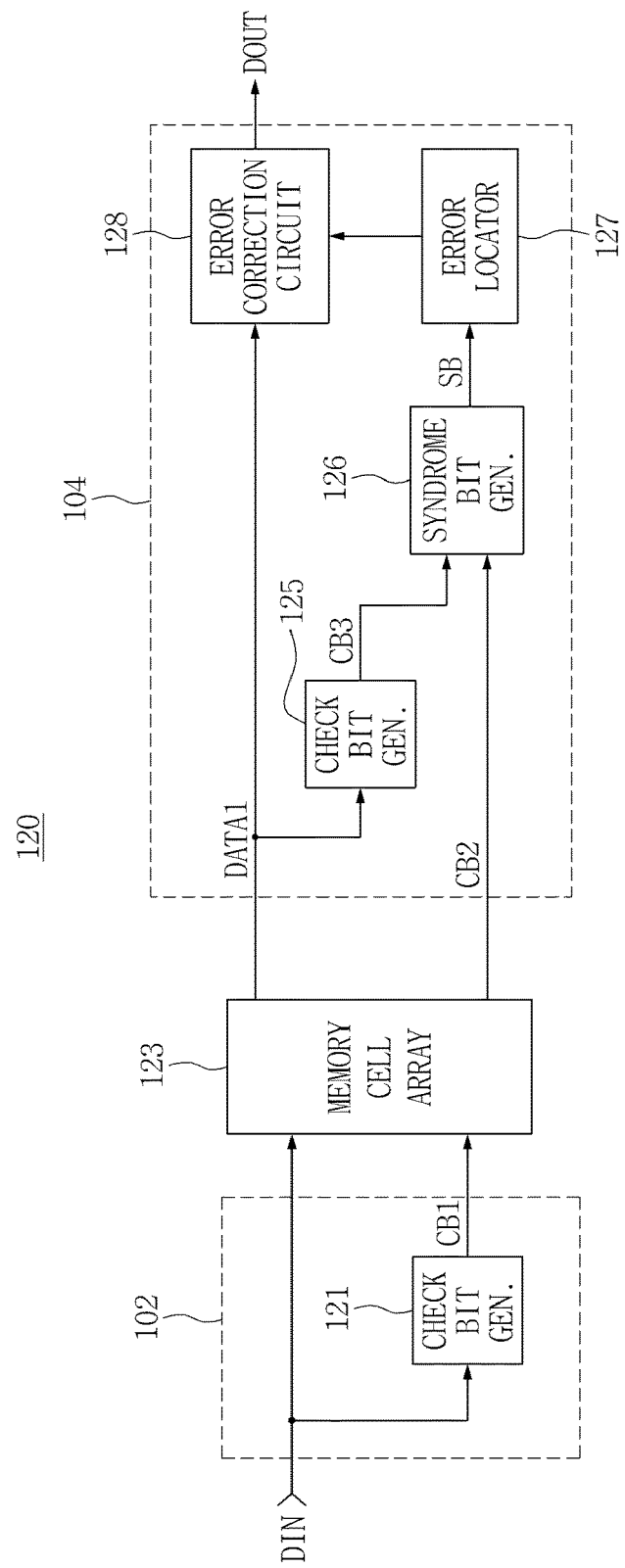
FIG. 2 is a block diagram illustrating an example of a configuration of the semiconductor memory device included in the memory system of FIG. 1.

FIG. 2 is a block diagram illustrating an example of a configuration of a semiconductor memory device 120 included in the memory system 100 of FIG. 1.

Referring to FIG. 2, the semiconductor memory device 120 may include an encoding circuit (which may also be referred to as an encoder) 102, a memory cell array 123, and a decoding circuit (which may also be referred to as a decoder) 104. The encoding circuit 102 may include a first check bit generator 121. The decoding circuit 104 may include a second check bit generator 125, a syndrome bit generator 126, an error locator 127, and an error correction circuit 128.

According to at least one example embodiment of the inventive concepts, the first check bit generator 121, the second check bit generator 125, the syndrome bit generator 126, the error locator 127, and the error correction circuit 128 may be embodied as circuitry or one or more circuits. The first check bit generator 121 may generate the first check bits CB1 based on a first data DIN received from outside of the semiconductor memory device 120 and a predetermined parity generator matrix (H-matrix). The memory cell array 123 may include a plurality of memory cell groups each including a plurality of memory cells, and stores the first data DIN and the first check bits CB1. The first check bit generator 121 may divide an ECC code word including the first data DIN and the first check bits CB1 into the plurality of ECC code word groups, and disposes the miscorrected bit, caused by error bits included in the first ECC code word group, in another ECC code word group rather than the first ECC code word group.

The second check bit generator 125 may generate second check bits CB3 based on second data DATA1 received from the memory cell array 123. The syndrome bit generator 126 may generate syndrome bits SB based on the second check bits CB3 and third check bits CB2 received from the memory cell array 123. The error locator 127 may decode the syndrome bits SB. The error correction circuit 128 may correct the second data DATA1 in response to output of the error locator 127 and output data DOUT.

Conventionally, in a memory system including a semiconductor memory device, when error bits exist in one ECC code word group of an ECC code word, the memory system could not detect a miscorrected bit caused by the error bits although the miscorrected bit is an error bit. For example, when the ECC code has an ability of correcting one error bit and two error bits exist in one ECC code word group, a normal bit may be wrongly corrected due to the error bits. However, the miscorrected bit could not be detected by a memory controller outside the semiconductor memory device.

According to at least some example embodiments, the semiconductor memory device may dispose a miscorrected bit, caused by error bits included in a first ECC code word group, in another ECC code word group rather than the first ECC code word group.

Further, when error bits exist only in a first ECC code word sub group of a first ECC code word group, the semiconductor memory device may dispose a miscorrected bit, which is caused by the error bits in the first ECC code word sub group of the first ECC code word group, in another ECC code word group rather than the first ECC code word group. Further, when the error bits exist in the first ECC code word sub group and a second ECC code word sub group of the first ECC code word group, the semiconductor memory device may dispose a miscorrected bit, caused by the error bits, in another ECC code word group rather than the first ECC code word group. Therefore, the semiconductor memory device 120 according to at least some example embodiments may detect the miscorrected bit outside the semiconductor memory device 120.

For example, according to example embodiments, when the ECC code word may be able to detect and correct k error bits, and k+1 error bits exist in the first ECC code word group, the semiconductor memory device 120 may dispose a miscorrected bit, caused by error bits included in the first ECC code word group, in another ECC code word group rather than the first ECC code word group.

According to example embodiments, when the ECC code word is able to detect and correct one error bit, and two error bits exist in the first ECC code word group, the semiconductor memory device 120 may dispose a miscorrected bit caused by error bits included in another ECC code word group rather than the first ECC code word group.

According to example embodiments, each of the ECC code word groups may have 16 bits or 32 bits.

According to example embodiments, when a size of the ECC code word is greater than that of a pre-fetch unit, the semiconductor memory device 120 may dispose the miscorrected bit in a group, which is not pre-fetched, included in the ECC code word. The pre-fetch unit may be an amount of data pre-fetched in a pre-fetch operation. For example, the pre-fetch unit may be, for example, 256 bits of data.

According to example embodiments, the semiconductor memory device 120 may be a stacked memory device in which a plurality of chips transceive (i.e., receive and/or transmit) data and control signals through a through-silicon-via (TSV).

According to example embodiments, when error bits are generated in the semiconductor memory device, the miscorrected bits may be detected and corrected outside the semiconductor memory device.

According to example embodiments, when the error bits exist only in the first ECC code word sub group of the first ECC code word group and a miscorrected bit caused by the error bits exist in the first ECC code word sub group, the semiconductor memory device may dispose the miscorrected bit in the first ECC code word sub group as it is.

According to at least some example embodiments, when the error bits exist in the first ECC code word sub group and the second ECC code word sub group of the first ECC code word group, the semiconductor memory device may dispose the miscorrected bit caused by the error bits in another ECC code word group rather than the first ECC code word group.

Figure 3:
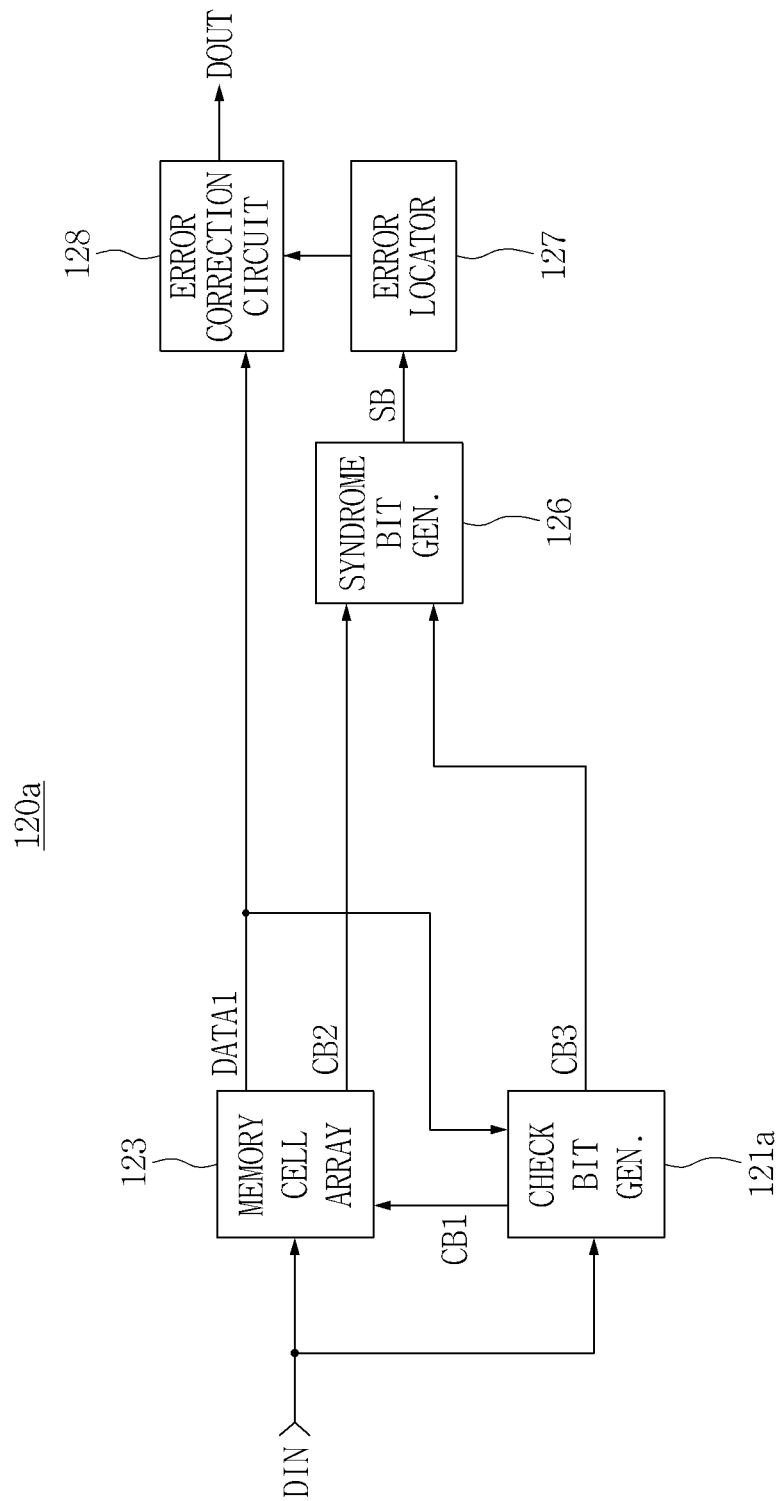
FIG. 3 is a block diagram illustrating at least one example embodiment of a configuration of the semiconductor memory device included in the memory system of FIG. 1.

FIG. 3 is a block diagram illustrating another example of a configuration of the semiconductor memory device included in the memory system of FIG. 1.

Referring to FIG. 3, a semiconductor memory device 120a may include a check bit generator 121a, a memory cell array 123, a syndrome bit generator 126, an error locator 127, and an error correction circuit 128.

In the semiconductor memory device 120a, the check bit generator 121a may perform both functions of the first check bit generator 121 and the second check bit generator 125 in the semiconductor memory device 120 shown in FIG. 2. For example, the check bit generator 121a shown in FIG. 3 may generate check bits for encoding and decoding. An operation of the semiconductor memory device 120*a* shown in FIG. 3 is similar to that of the semiconductor memory device 120 shown in FIG. 2.

Figure 4:
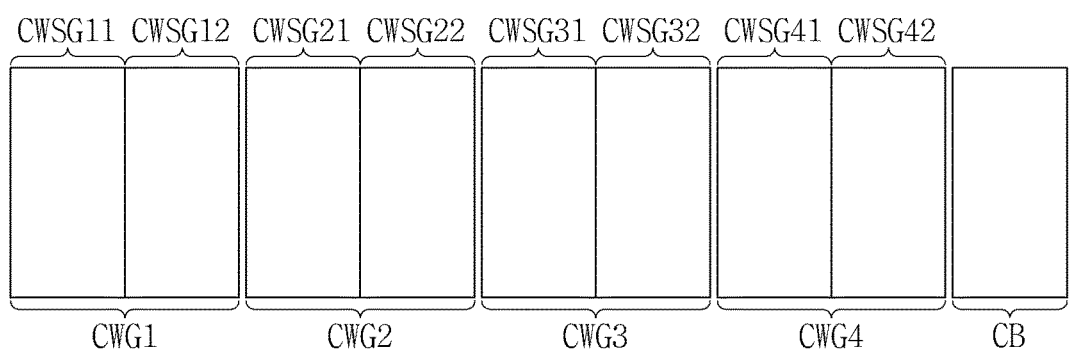
FIG. 4 is a diagram illustrating an example of a configuration of an error correcting code (ECC) word used in error correction of the semiconductor memory device shown in FIG. 2.

FIG. 4 is a diagram illustrating an example of a configuration of an ECC code word used in error correction of the semiconductor memory device 120 shown in FIG. 2.

Referring to FIG. 4, an ECC code word 106 used for error correction of the semiconductor memory device 120 may include ECC code word groups CWG1, CWG2, CEG3, and CWG4 and check bits CB. The ECC code word group CWG1 may include ECC code word sub groups CWSG11 and CWSG12, the ECC code word group CWG2 may include ECC code word sub groups CWSG21 and CWSG22, the ECC code word group CWG3 may include ECC code word sub groups CWSG31 and CWSG32, and the ECC code word group CWG4 may include ECC code word sub groups CWSG41 and CWSG42.

In general, the ECC code word is a terminology which includes both data and check bits, but in this specification, only a data part of the ECC code word will be referred to as the ECC code word group for the convenience of description.

Figure 5:
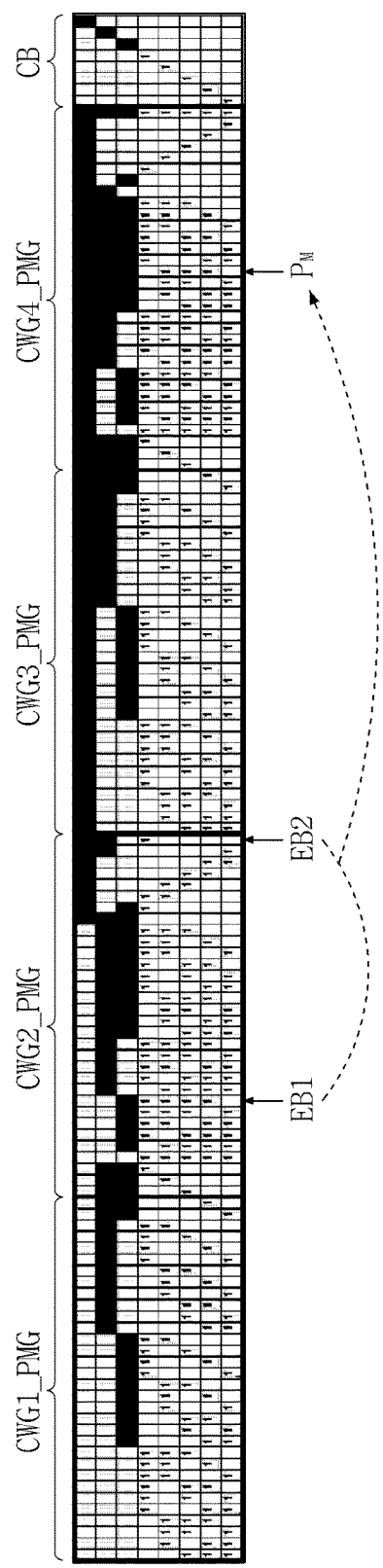
FIG. 5 is a diagram illustrating a method of correcting an error in the semiconductor memory device according to at least one example embodiment of the inventive concepts.

FIG. 5 is a diagram illustrating a method of correcting an error in the semiconductor memory device 120 according to at least some example embodiments of the inventive concepts.

FIG. 5 illustrates a parity generator matrix. The parity generator matrix may include a first parity generator matrix group CWG1_PGM corresponding to the first ECC code word group CWG1, a second parity generator matrix group CWG2_PGM corresponding to the second ECC code word group CWG2, a third parity generator matrix group CWG3_PGM corresponding to the third ECC code word group CWG3, and a fourth parity generator matrix group CWG4_PGM corresponding to the fourth ECC code word group CWG4. FIG. 5 illustrates the case in which each ECC code word group corresponding to each parity generator matrix group includes 32-bit data.

According to the present invention, when two error bits are generated in any one ECC code word group, and a column equal to a result value of a bit-by-bit exclusive OR (XOR) operation on columns of a parity generator matrix group corresponding to positions of error bits is disposed in a specific position of the parity generator matrix, a bit of an ECC code word group corresponding to the specific position may be generated as a miscorrected bit.

In the embodiment of FIG. 5, when 9th bit and 32nd bit of the second ECC code word group are error bits, a result value of bit-by-bit XOR operation of a 9th column (00111110, EB1) and a 32nd column (11010000, EB2) of the second parity generator matrix group CWG2_PGM is 11101110, and the result value is equal to an 18th column PM of the fourth parity generator matrix group CWG4_PGM, and therefore the 18th bit of the fourth ECC code word group CWG4 may be generated as a miscorrected bit.

According to the present invention, the miscorrected bit caused by two error bits disposed in an arbitrary ECC code word group may be disposed in another ECC code word group rather than the arbitrary ECC code word group by not disposing a column having a value equal to a value of a bit-by-bit XOR operation on arbitrary two columns in arbitrary parity generator matrix group in the arbitrary parity generator matrix group, but disposing in another parity generator matrix group different from the arbitrary parity generator matrix group.

FIGS. 6 to 9 are diagrams illustrating a configuration of a memory cell array included in the semiconductor memory device of FIG. 2. In FIGS. 6 to 9, only a part of the memory cell array which stores a data part of a code word is shown. In fact, the memory cell array 130 may include memory cells for storing parities, which are check bits, in addition to memory cells for the data part.

Figure 6:
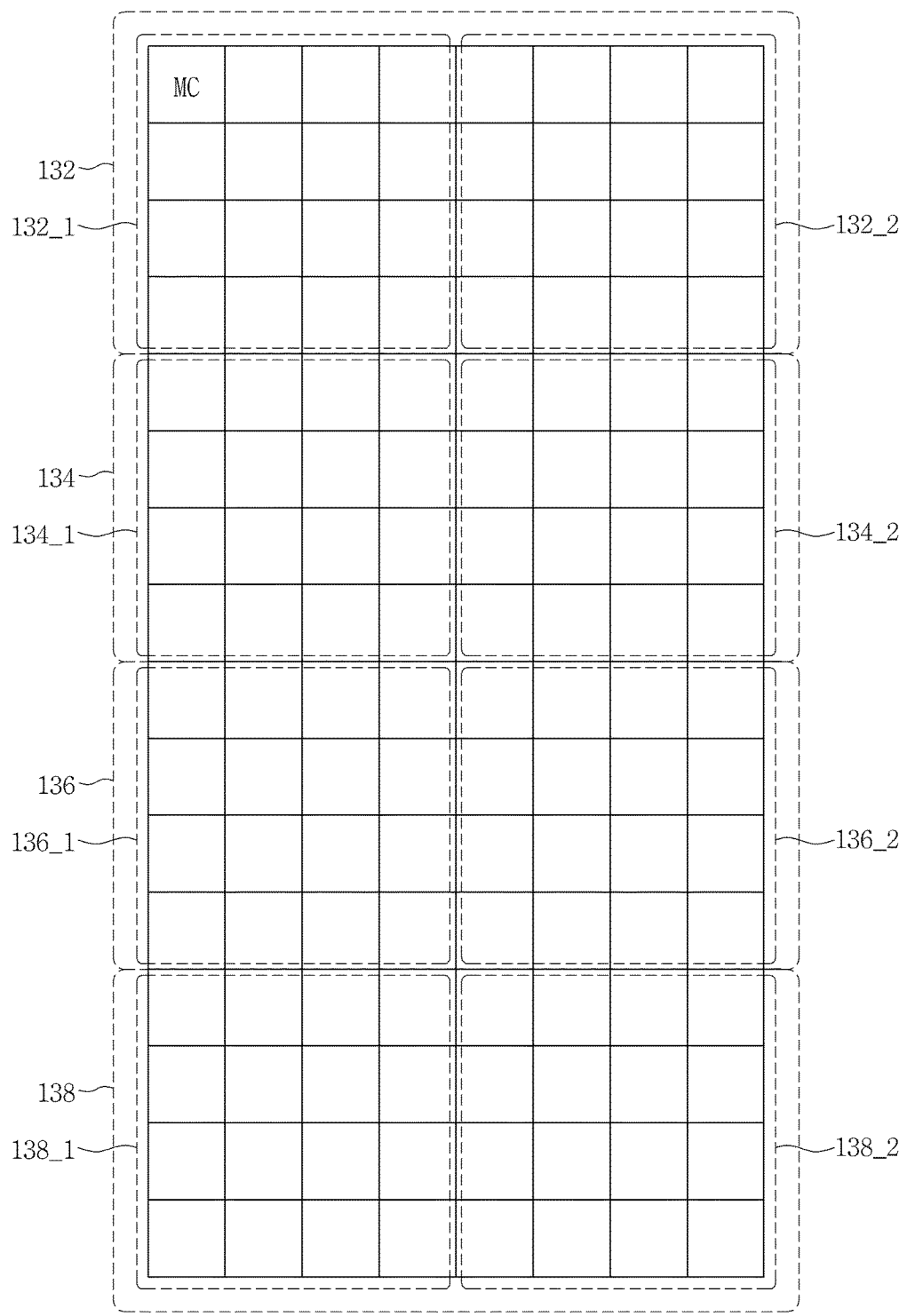
FIGS. 6 to 9 are diagrams illustrating a configuration of a memory cell array included in the semiconductor memory device of FIG. 2.

Referring to FIG. 6, the memory cell array 130*a* may include memory cell groups 132, 134, 136, and 138 each having a plurality of memory cells MC. The memory cell group 132 may include memory cell sub groups 132_1 and 132_2, the memory cell group 134 may include memory cell sub groups 134_1 and 134_2, the memory cell group 136 may include memory cell sub groups 136_1 and 136_2, and the memory cell group 138 may include memory cell sub groups 138_1 and 138_2.

The memory cell groups 132, 134, 136, and 138 in FIG. 6 may correspond to the ECC code word groups CWG1, CWG2, CWG3, and CWG4, respectively. The memory cell sub groups 132_1 and 132_2 may correspond to the ECC code word sub groups CWSG11 and CWSG12, the memory cell sub groups 134_1 and 134_2 may correspond to the ECC code word sub groups CWSG21 and CWSG22, the memory cell sub groups 136_1 and 136_2 may correspond to the ECC code word sub groups CWSG31 and CWSG32, and the memory cell sub groups 138_1 and 138_2 may correspond to the ECC code word sub groups CWSG41 and CWSG42. For example, the ECC code word sub groups CWSG11 and CWSG12 may be stored in the memory cell sub groups 132_1 and 132_2, the ECC code word sub groups CWSG21 and CWSG22 may be stored in the memory cell sub groups 134_1 and 134_2, the ECC code word sub groups CWSG31 and CWSG32 may be stored in the memory cell sub groups 136_1 and 136_2, and the ECC code word sub groups CWSG41 and CWSG42 may be stored in the memory cell sub groups 138_1 and 138_2.

Figure 7:
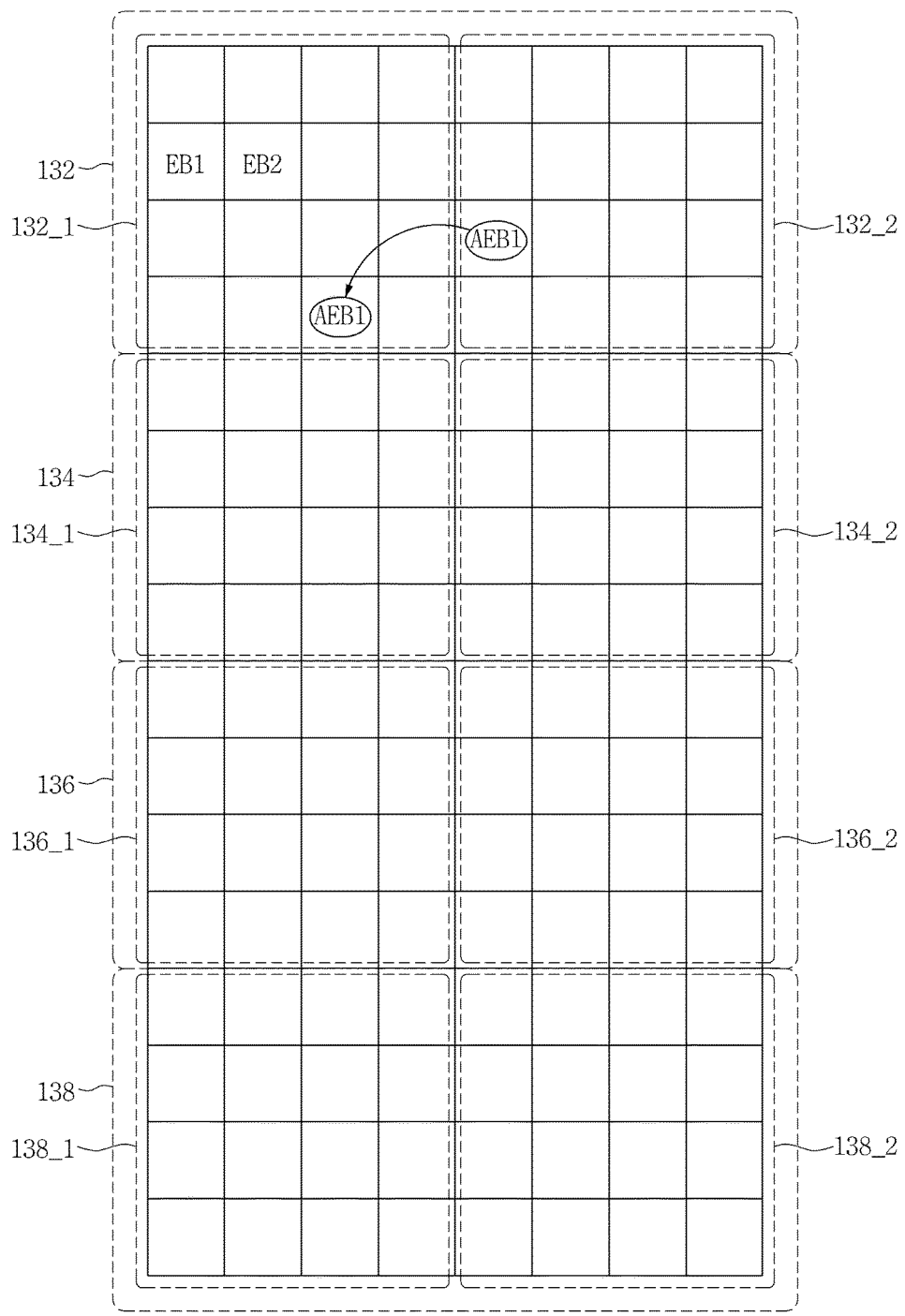

Referring to FIG. 7, when a miscorrected bit AEB1 caused by error bits EB1 and EB2 which exist in the memory cell sub group 132_1 is in the memory cell sub group 132_2, the semiconductor memory device 120 may dispose the miscorrected bit AEB1 in the memory cell sub group 132_1.

Figure 8:
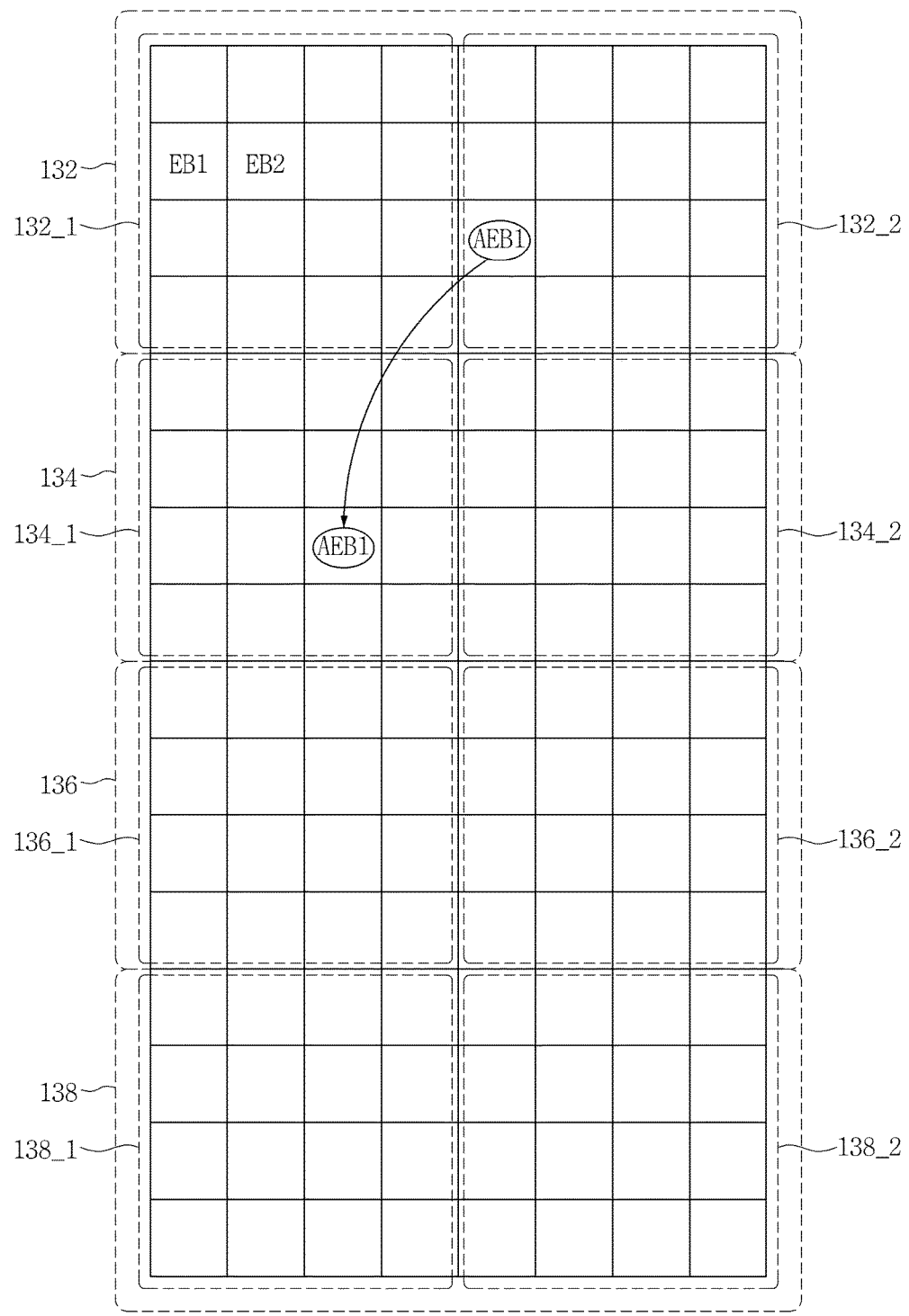

Referring to FIG. 8, when a miscorrected bit AEB1 caused by the error bits EB1 and EB2 which exist in the memory cell sub group 132_1 is in the memory cell sub group 132_2, the semiconductor memory device 120 may dispose the miscorrected bit AEB1 in the memory cell sub group 134_1, but is not limited thereto. For example, the semiconductor memory device 120 may dispose the miscorrected bit AEB1 in the memory cell sub group 134_2.

Further, when the miscorrected bit AEB1 caused by the error bits EB1 and EB2 which exist in the memory cell sub group 132_1, is in the memory cell sub group 132_2, the semiconductor memory device 120 may dispose the miscorrected bit AEB1 in the memory cell group 136 or in the memory cell group 138.

Further, when the miscorrected bit AEB1 caused by the error bits EB1 and EB2 which exist in the memory cell sub group 132_1 is in the memory cell sub group 132_1, the semiconductor memory device 120 may dispose the miscorrected bit AEB1 in the memory cell sub group 132_1 as it is.

Figure 9:
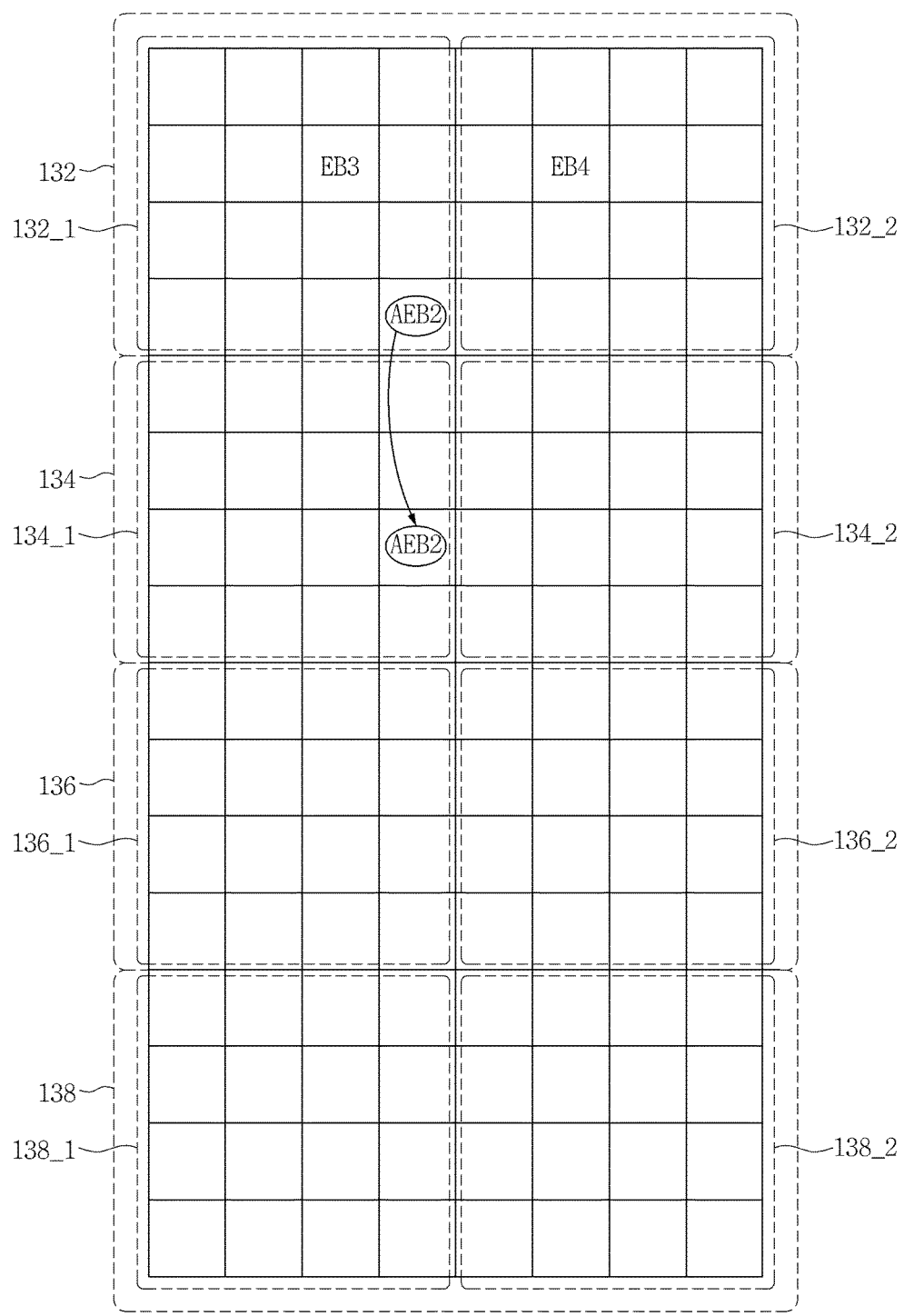

Referring to FIG. 9, when error bits EB3 and EB4 respectively exist in the memory cell sub group 132_1 and the memory cell sub group 132_2 of the first ECC code word group, the semiconductor memory device 120 may dispose a miscorrected bit AEB2 caused by the error bits EB3 and EB4 in the memory cell sub group 134_1 of the memory cell group 134, but is not limited thereto. For example, the semiconductor memory device 120 may dispose the miscorrected bit AEB2 in the memory cell sub group 134_2 of the memory cell group 134.

When the miscorrected bit AEB2 caused by the error bits EB3 and EB4 which respectively exist in the memory cell sub group 132_1 and the memory cell sub group 132_2 is in the memory cell sub group 132_1, the semiconductor memory device 120 may dispose the miscorrected bit AEB2 in the memory cell group 136 or in the memory cell group 138.

Similarly, when the miscorrected bit AEB2 caused by the error bits EB3 and EB4 which respectively exist in the memory cell sub group 132_1 and the memory cell sub group 132_2 is in the memory cell sub group 132_2, the semiconductor memory device 120 may dispose the miscorrected bit AEB2 in the memory cell group 136 or in the memory cell group 138.

Figure 10:
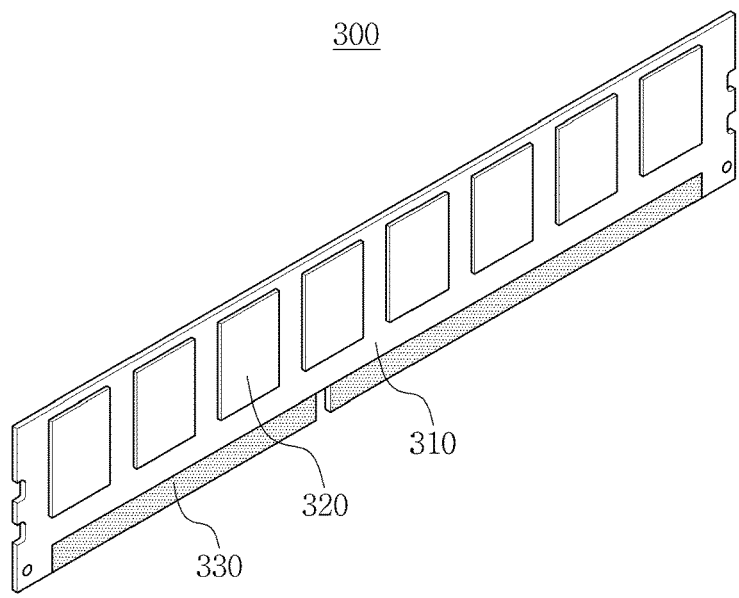
FIGS. 10 to 12 are diagrams illustrating memory modules including the semiconductor memory device according to at least one example embodiment of the inventive concepts.
Figure 11:
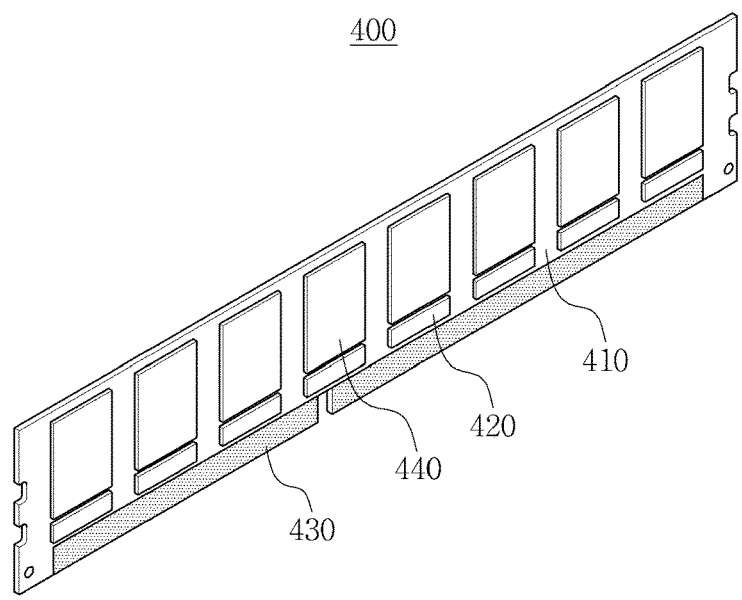
Figure 12:
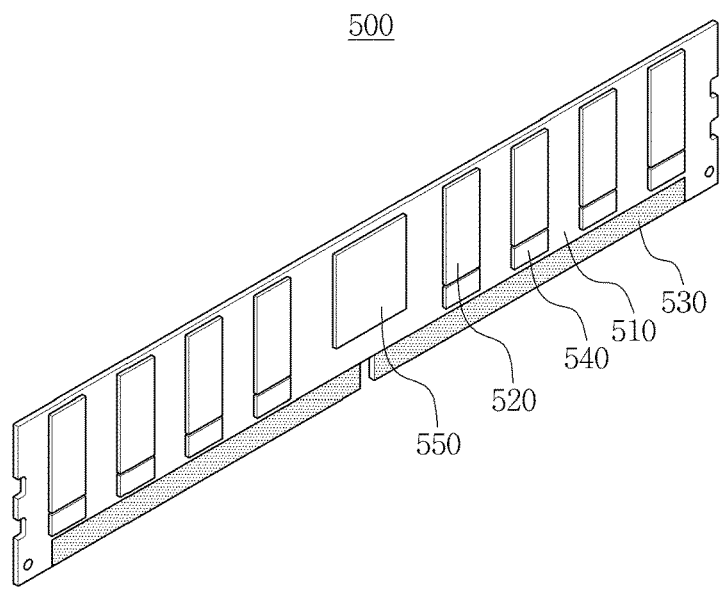

FIGS. 10 to 12 are diagrams illustrating memory modules including the semiconductor memory device according to at least some example embodiments of the inventive concepts.

Referring to FIG. 10, a memory module 300 may include a printed circuit board (PCB) 310, a plurality of memory chips 320, and a connector 330. The plurality of memory chips 320 may be bonded to top and bottom surfaces of the PCB 310. The connector 330 may be electrically connected to the plurality of memory chips 320 through conductive lines (not shown). Also, the connector 330 may be connected to a slot of an external host.

Referring to FIG. 11, a memory module 400 may include a PCB 410, a plurality of memory chips 440, a connector 430, and a plurality of buffers 420. Each of the plurality of buffers 420 may be disposed between the memory chips 440 and the connector 430.

The memory chips 440 and the buffers 420 may be provided on top and bottom surfaces of the PCB 410. The memory chips 440 and the buffers 420 formed on the top and bottom surfaces of the PCB 410 may be connected through a plurality of via holes.

Referring to FIG. 12, a memory module 500 may include a PCB 510, a plurality of memory chips 520, a connector 530, a plurality of buffers 540, and a controller 550.

The memory chips 520 and the buffers 540 may be provided on top and bottom surfaces of the PCB 510. The memory chips 520 and the buffers 540 formed on the top and bottom surfaces of the PCB 510 may be connected through a plurality of via holes.

In FIGS. 10 to 12, the memory chips may include the semiconductor memory devices according to at least some example embodiments of the inventive concepts. Therefore, the memory chips may dispose a miscorrected bit, caused by error bits included in a first ECC code word group, in another ECC code word group rather than the first ECC code word group. Therefore, the miscorrected bit may be detected outside the memory chips.

For example, when the error bits exist only in the first ECC code word sub group of the first ECC code word group, the memory chips may dispose the miscorrected bit, caused by the error bits in the first ECC code word sub group of the first ECC code word group, in another ECC code word group rather than the first ECC code word group. Further, when the error bits exist in the first ECC code word sub group and the second ECC code word sub group of the first ECC code word group, the memory chips may dispose the miscorrected bit, caused by the error bits, in another ECC code word group rather than the first ECC code word group. Therefore, the miscorrected bit may be detected outside of the memory chips.

Figure 13:
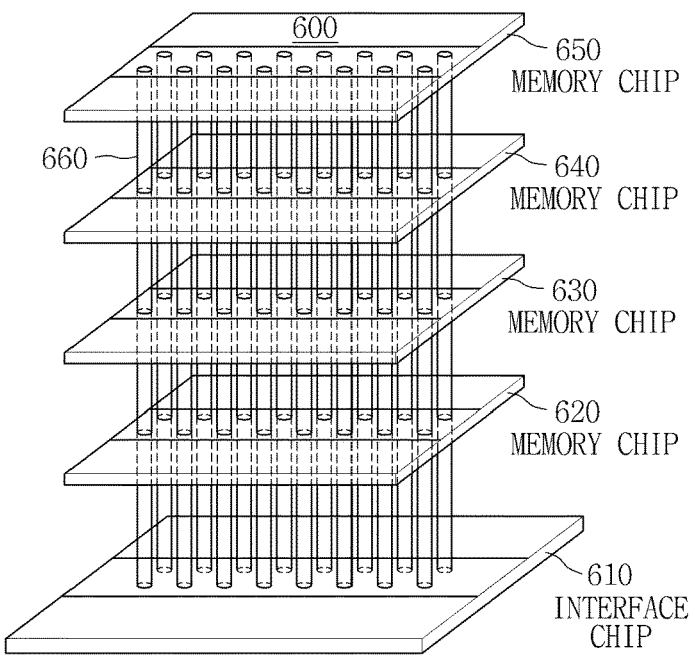
FIG. 13 is a schematic perspective view illustrating an example of a stacked semiconductor device including the semiconductor memory device according to at least one example embodiment of the inventive concepts.

FIG. 13 is a schematic perspective view illustrating an example of a stacked semiconductor device 600 including the semiconductor memory device according to at least some example embodiments of the inventive concepts.

Referring to FIG. 13, the stacked semiconductor device 600 may include an interface chip 610, and memory chips 620, 630, 640, and 650 which are electrically connected through TSVs 660. Although the TSVs 660 in two rows are shown in FIG. 13, the stacked semiconductor device 600 may include any number of TSVs.

The memory chips 620, 630, 640, and 650 included in the stacked semiconductor device 600 may include the semiconductor memory device according to at least some example embodiments of the inventive concepts. Therefore, the memory chips 620, 630, 640, and 650 may dispose a miscorrected bit, caused by error bits included in a first ECC code word group, in another ECC code word group rather than the first ECC code word group. Therefore, the miscorrected bit may be detected and corrected outside the memory chips.

Further, when error bits exist only in the first ECC code word sub group of the first ECC code word group, the memory chips may dispose a miscorrected bit, caused by the error bits in the first ECC code word sub group of the first ECC code word group, in another ECC code word group rather than the first ECC code word group. Further, when the error bits exist in the first ECC code word sub group and the second ECC code word sub group of the first ECC code word group, the memory chips may dispose the miscorrected bit, caused by the error bits, in another ECC code word group rather than the first ECC code word group. Therefore, the miscorrected bit may be detected and corrected outside the memory chips.

The interface chip 610 may perform interfacing between the memory chips 620, 630, 640, and 650 and external devices.

Figure 14:
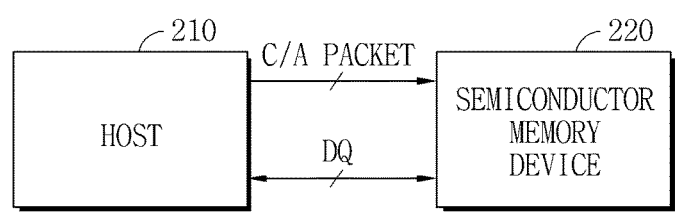
FIG. 14 is a block diagram illustrating a memory system including the semiconductor memory device according to at least one example embodiment of the inventive concepts.

FIG. 14 is a block diagram illustrating a memory system including the semiconductor memory device according to at least some example embodiments of the inventive concepts.

Referring to FIG. 14, the memory system 200 may include a host 210 and a semiconductor memory device 220.

The host 210 may generate an address signal ADD and a command CMD, and provide the address signal ADD and the command CMD to the semiconductor memory device 220 through buses. Data DQ may be transmitted from the host 210 to the semiconductor memory device 220 through the buses, or transmitted from the semiconductor memory device 220 to the host 210 through the buses.

In the memory system 200 of FIG. 14, the host 210 and the memory device 220 may have the same structure and operation as that described above with respect to the host 110 and the memory device 120 with the exception that the command CMD and the address signal ADD are integrated to form a packetized signal C/A which is different from the memory system 100 of FIG. 1.

Figure 15:
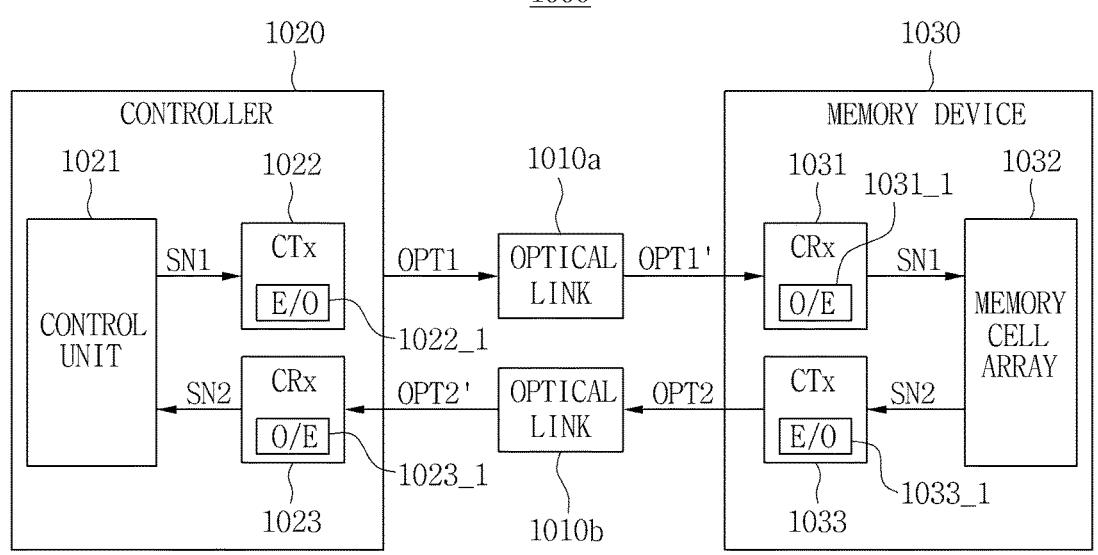
FIG. 15 is a block diagram illustrating an example of a memory system including the semiconductor memory device and an optical link according to at least one example embodiment of the inventive concepts.

FIG. 15 is a block diagram illustrating an example of a memory system including a semiconductor memory device and an optical link according to at least some example embodiments of the inventive concepts.

Referring to FIG. 15, a memory system 1000 may include a controller 1020, a memory device 1030, and a plurality of optical links 1010a and 1010b configured to interconnect the controller 1020 and the memory device 1030. The controller 1020 may include a control unit 1021, a first transmitter 1022, and a first receiver 1023. The control unit 1021 may transmit a control signal SN1 to the first transmitter 1022.

The first transmitter 1022 may include a first optical modulator 1022_1, which may convert the control signal SN1, which is an electrical signal, into a first optical transmission signal OPT1, and transmit the first optical transmission signal OPT1 to the optical link 1010a.

The first receiver 1023 may include a first optical demodulator 1023_1, which may convert a second optical receiving signal OPT2' received from the optical link 1010b into a data signal SN2, which is an electrical signal, and transmit the data signal SN2 to the control unit 1021.

The memory device 1030 may include a second receiver 1031, a memory cell array 1032, and a second transmitter 1033. The second receiver 1031 may include a second optical modulator 1031_1, which may convert a first optical receiving signal OPT1' received from the optical link 1010a into the control signal SN1, which is the electrical signal, and transmit the control signal SN1 to the memory cell array 1032.

In the memory cell array 1032, data may be written based on the control signal SN1, or the data signal SN2 output from the memory cell array 1032 may be transmitted to the second transmitter 1033.

The second transmitter 1033 may include a second optical modulator 1033_1, which may convert the data signal SN2, which is the electrical signal, into a second optical data signal OPT2, and transmit the second optical data signal OPT2 to the optical link 1010b.

The memory device 1030 may include the semiconductor memory device according to at least some example embodiments of the inventive concepts. For example, the memory device 1030 may be an example implementation of the memory device 120 and/or the memory device 220. Therefore, the miscorrected bit may be detected and corrected outside the memory device 1030.

Figure 16:
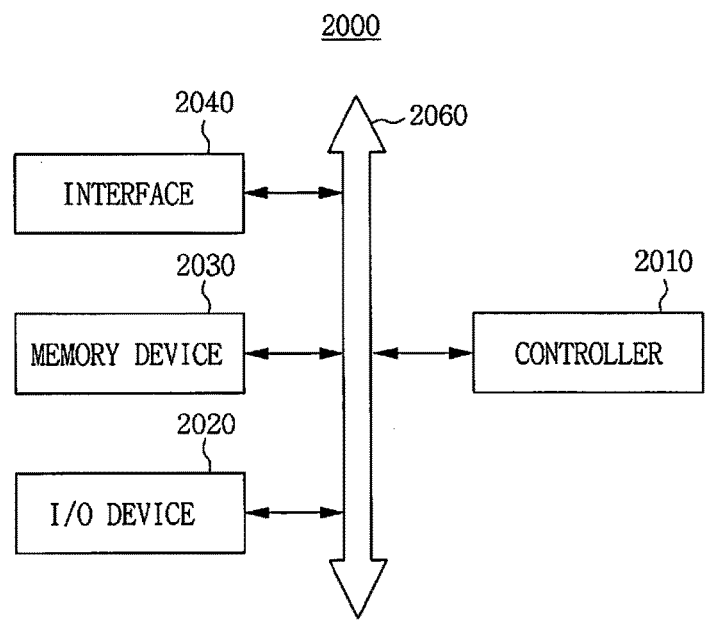
FIG. 16 is a block diagram illustrating an example of an electronic system including the semiconductor memory device according to at least one example embodiment of the inventive concepts.

FIG. 16 is a block diagram illustrating an example of an electronic system 2000 including the semiconductor memory device according to at least some example embodiments of the inventive concepts.

Referring to FIG. 16, the electronic system 2000 according to at least some example embodiments of the inventive concepts may include a controller 2010, an input and output device 2020, a memory device 2030, an interface 2040, and a bus 2060. The memory device 2030 may include the semiconductor memory device according to at least some example embodiments of the inventive concepts. For example, the memory device 2030 may be an example implementation of the memory device 120 and/or the memory device 220. Therefore, the memory device 2030 may dispose a miscorrected bit, caused by error bits included in a first ECC code word group, in another ECC code word group rather than the first ECC code word group. Therefore, the miscorrected bit may be detected and corrected outside the memory device 2030.

Further, when error bits exist only in a first ECC code word sub group of the first ECC code word group, the memory device 2030 may dispose a miscorrected bit, caused by the error bits in the first ECC code word sub group of the first ECC code word group, in another ECC code word group rather than the first ECC code word group. Further, when the error bits exist in the first ECC code word sub group and a second ECC code word sub group of the first ECC code word group, the memory device 2030 may dispose a miscorrected bit, caused by the error bits in another ECC code word group rather than the first ECC code word group. Therefore, the miscorrected bit may be detected and corrected outside of the memory device 2030.

The bus 2060 may provide a path in which data is mutually transferred among the controller 2010, the input and output device 2020, the memory device 2030, and the interface 2040.

The controller 2010 may include any one of logic devices capable of performing functions of at least one of a microprocessor, a digital signal processor, and a microcontroller, or functions similar thereto. The input and output device 2020 may include at least one selected from a keypad, a keyboard, and a display device. The memory device 2030 may serve to store data and/or instructions to be performed by the controller 2010.

The memory device 2030 may include a volatile memory chip, such as a dynamic random access memory (DRAM) and a static random access memory (SRAM), a non-volatile memory chip, such as a flash memory, a phase change memory, a magnetic random access memory (MRAM), or a resistive random access memory (RRAM), and/or a combination of thereof.

The interface 2040 may serve to transmit/receive data to/from a communication network. The interface 2040 may include an antenna, wired or wireless transceivers, or the like, and transceive data through wires or wirelessly. In addition, the interface 2040 may include optical fibers to transceive data through the optical fibers. The electronic system 2000 may be further provided with an application chipset, a camera image processor, and an input/output (I/O) device.

The electronic system 2000 may be implemented as a mobile system, a personal computer, an industrial computer, or a logic system which performs various functions. For example, the mobile system may be any one of a personal digital assistant (PDA), a portable computer, a Web tablet, a mobile phone, a wireless phone, a laptop computer, a memory card, a digital music system, and an information transmitting/receiving system. When the electronic system 2000 is an apparatus capable of performing wireless communication, the electronic system 2000 may be used in a communication system such as a code division multiple access (CDMA), a Global System for Mobile communication (GSM), a North American Digital Cellular (NADC), an Enhanced-Time Division. Multiple Access (E-TDMA), a Wideband CDMA (WCDMA), or a CDMA 2000.

FIGS. 17 to 21 are flow charts illustrating methods of correcting an error in a semiconductor memory device according to at least some example embodiments of the inventive concepts.

Figure 17:
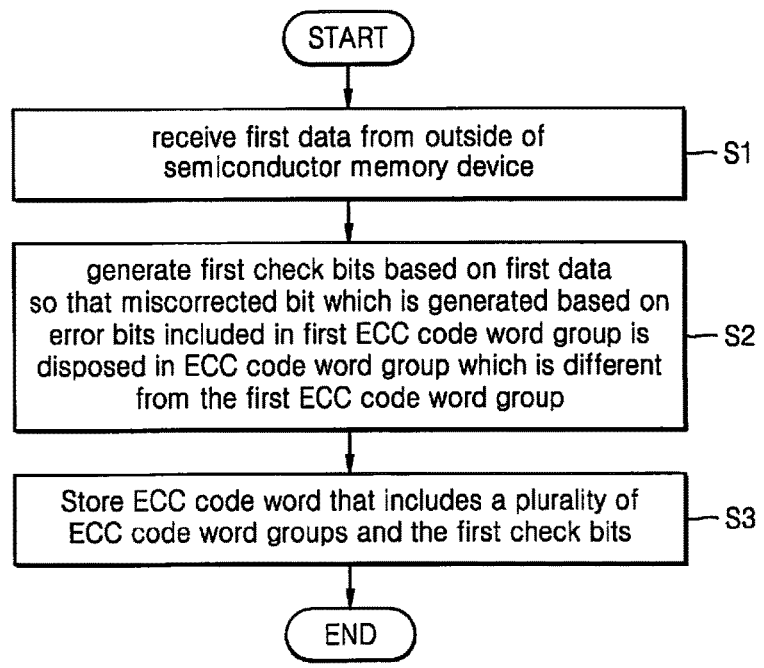
FIGS. 17 to 21 are flow charts illustrating methods of correcting an error in a semiconductor memory device according to at least one example embodiment of the inventive concepts.
Figure 18:
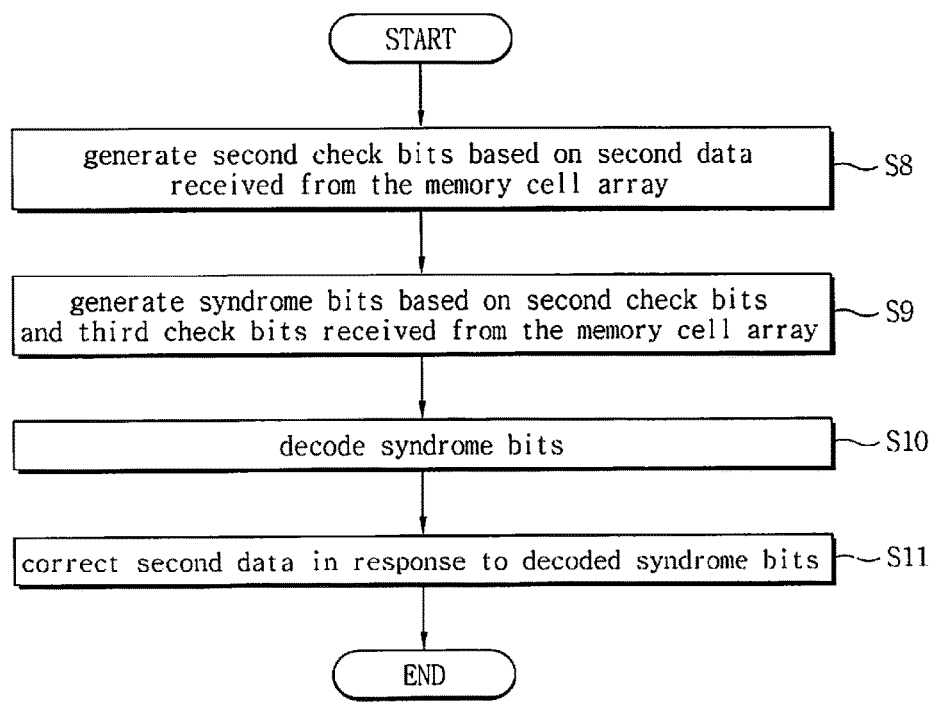

Referring to FIGS. 17 and 18, a method of correcting an error in a semiconductor memory device according to at least some example embodiments of the inventive concepts may include the following operations.

In operation S1, the first check bit generator 121 may receive first data from outside the semiconductor memory device.

In operation S2, the first check bit generator 121 may generate first check bits based on the first data so that a miscorrected bit, caused by error bits included in a first ECC code word group, is disposed in another ECC code word group rather than the first ECC code word group (S2).

In operation S3, the plurality of memory cell groups may store an ECC code word including a plurality of ECC code word groups and the first check bits.

In operation S8, the second check bit generator 125 may generate second check bits based on second data received from the memory cell array.

In operation S9, the syndrome bit generator 126 may generate syndrome bits based on the second check bits and third check bits received from the memory cell array.

In operation S10, the error locator 127 may decode the syndrome bits.

In operation S11, the error correction circuit may correct the second data based on the decoded syndrome bits.

Figure 19:
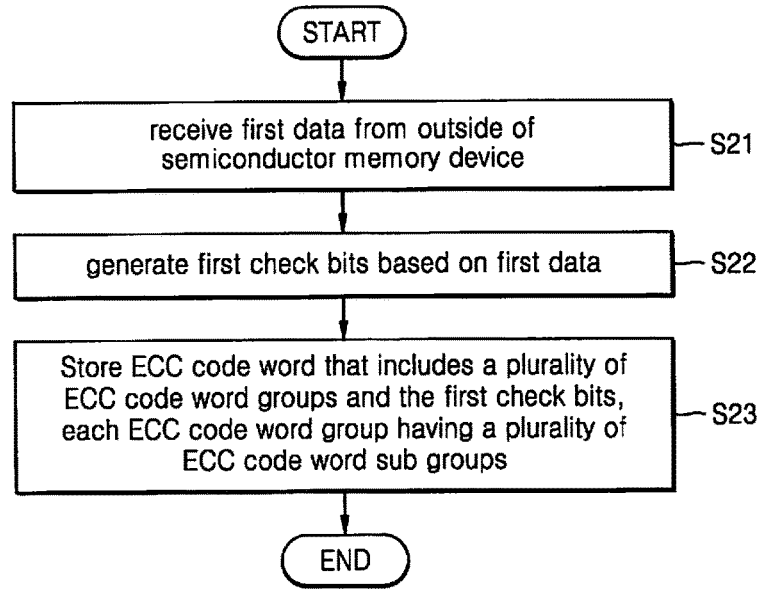
Figure 20:
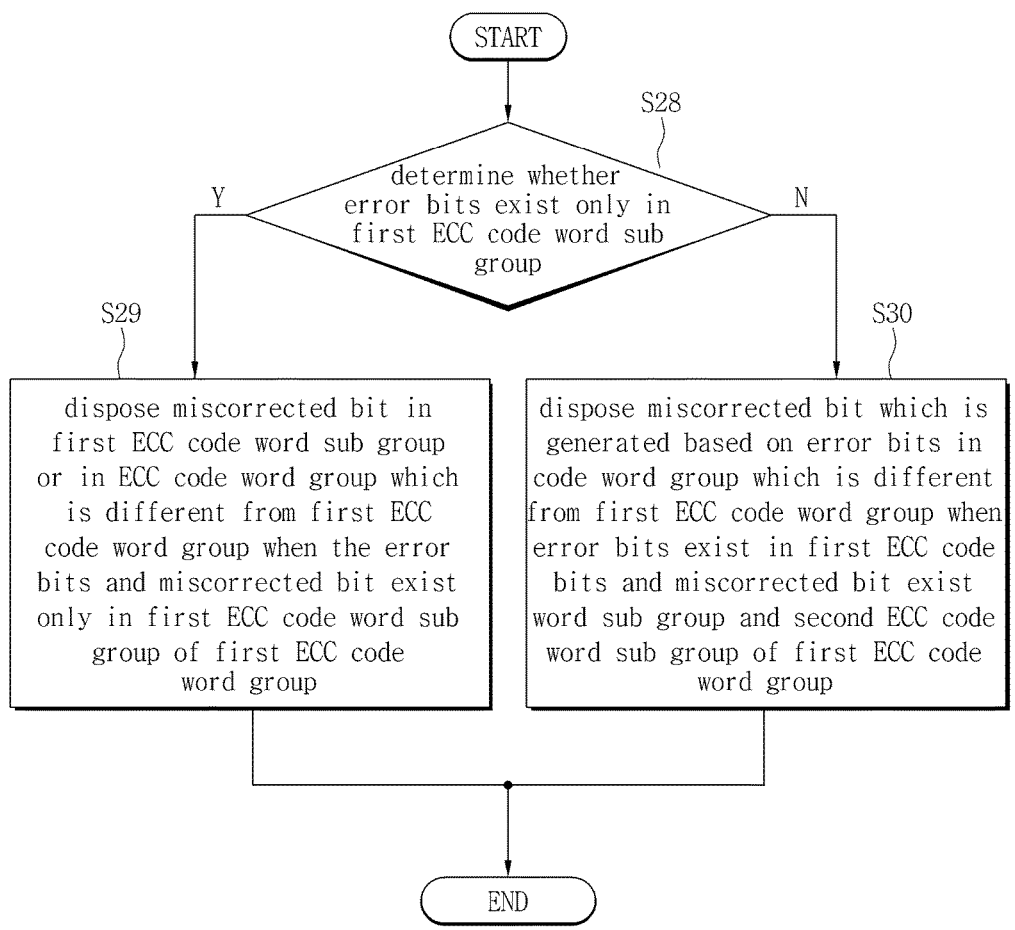

Referring to FIGS. 19 and 20, a method of correcting an error in a semiconductor memory device according to at least some example embodiments of the inventive concepts may include the following operations.

In operation S21, the first check bit generator 121 may receive the first data from outside the semiconductor memory device.

In operation S22, the first check bit generator 121 may generate the first check bits based on the first data.

In operation S23, the plurality memory cell groups may store an ECC code word including a plurality of ECC code word groups and the first check bits. Each ECC code word group may have a plurality of ECC code word sub groups.

In operation S28, the semiconductor memory device 120 may determine whether error bits exist only in the first ECC code word sub group.

In operation S29, the semiconductor memory device 120 may dispose a miscorrected bit in a first ECC code word sub group or in another ECC code word group rather than the first ECC code word group when the error bits and the miscorrected bit exist only in the first ECC code word sub group of the first ECC code word group.

In operation S30, the semiconductor memory device 120 may dispose the miscorrected bit caused by the error bits in another ECC code word group rather than the first ECC code word group when the error bits exist in the first ECC code word sub group and a second ECC code word sub group of the first ECC code word group.

The method of correcting the error in the semiconductor memory device shown in FIGS. 19 and 20 may further include generating second check bits based on second data received from the memory cell array, generating syndrome bits based on the second check bits and third check bits received from the memory cell array, decoding the syndrome bits, and correcting the second data based on the decoded syndrome bits.

Figure 21:
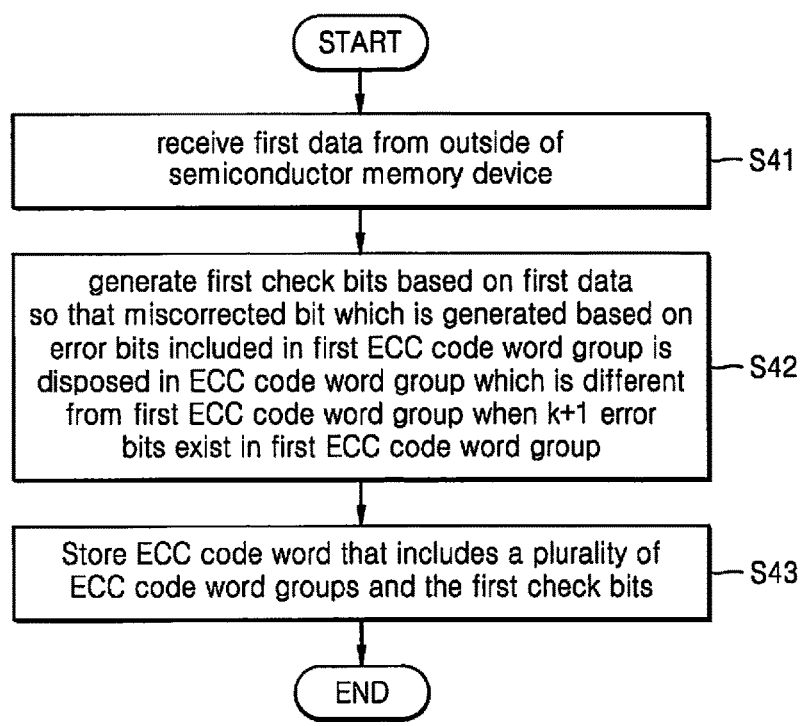

Referring to FIG. 21, a method of correcting an error in a semiconductor memory device according to at least some example embodiments of the inventive concepts may include the following operations.

In operation S41, the first check bit generator 121 may receive the first data from outside the semiconductor memory device.

In operation S42, the first check bit generator 121 may generate the first check bits based on the first data so that a miscorrected bit caused by error bits is disposed in another ECC code word group rather than the first ECC code word group when k+1 error bits exist in a first ECC code word group.

In operation S43, the plurality of memory cell groups may store an ECC code word including a plurality of ECC code word groups and the first check bits.

The method of correcting the error in the semiconductor memory device shown in FIG. 21 may further include generating second check bits based on second data received from the memory cell array, generating syndrome bits based on the second check bits and third check bits received from the memory cell array, decoding the syndrome bits, and correcting the second data based on the decoded syndrome bits.

The semiconductor memory device according to at least some example embodiments of the inventive concepts may dispose a miscorrected bit, caused by error bits included in a first ECC code word group, in another ECC code word group rather than the first ECC code word group.

Further, when error bits exist only in a first ECC code word sub group of a first ECC code word group, the semiconductor memory device may dispose a miscorrected bit, caused by the error bits in the first ECC code word sub group of the first ECC code word group, in another ECC code word group rather than the first ECC code word group. Further, when the error bits exist in the first ECC code word sub group and a second ECC code word sub group of the first ECC code word group, the memory chips may dispose the miscorrected bit caused by the error bits in another ECC code word group rather than the first ECC code word group. Therefore, semiconductor memory device according to example embodiments of the inventive concepts can detect and correct the miscorrected bit generated in the semiconductor memory device outside the memory chips.

At least some example embodiments of the inventive concepts may be applied to a semiconductor memory device and a memory system including the semiconductor memory device.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to included within the scope of the following claims.

What is claimed is:

1. A method of correcting an error in a semiconductor memory device including a memory cell array which includes a plurality of memory cell groups each including a plurality of memory cells, the method comprising:
   receiving first data from outside the semiconductor memory device;
   generating first check bits based on the first data and a first parity generator matrix,
   the first parity generator matrix including a plurality of columns of bits, the plurality of columns of bits being arranged in a plurality of parity generator matrix groups; and
   storing an error correcting code (ECC) code word including a plurality of ECC code word groups and the first check bits in the plurality of memory cell groups, the plurality of ECC code word groups corresponding to the plurality of parity generator matrix groups, respectively,
   wherein, for each parity generator matrix group of the first parity generator matrix, a result value of a bit-by-bit exclusive OR (XOR) operation performed on any two columns included in the parity generator matrix group is equal to a column number of a column, from among the plurality of columns of bits, that is not included in the parity generator matrix group such that,
      when a first ECC code word group, from among the plurality of ECC code word groups, includes error bits, a miscorrected bit that would be caused by the error bits as a result of performing an error correction operation on the first ECC code word group is located in an ECC code word group other than the first ECC code word group.

2. The method according to claim 1, further comprising:
generating second check bits based on second data received from the memory cell array;
generating syndrome bits based on the second check bits and third check bits received from the memory cell array;
decoding the syndrome bits; and
correcting the second data based on the decoded syndrome bits.

3. The method according to claim 1, wherein the first parity generator matrix is configured such that, if an error detection and correction capability of the ECC code word is one error bit, and two error bits exist in the first ECC code word group, a miscorrected bit that would be caused by the two error bits as a result of performing an error correction operation on the first ECC code word group is located in an ECC code word group other than the first ECC code word group.

4. The method according to claim 1, wherein the first parity generator matrix is configured such that, if an error detection and correction capability of the ECC code word is k error bits, and k+1 error bits exist in the first ECC code word group, a miscorrected bit that would be caused by the k+1 error bits as a result of performing an error correction operation on the first ECC code word group is located in an ECC code word group other than the first ECC code word group.

5. The method according to claim 1, wherein each of the ECC code word groups has 16 bits or 32 bits.

6. The method according to claim 1, wherein the first parity generator matrix is configured such that, if a size of the ECC code word is greater than that of a pre-fetch unit, the miscorrected bit that would be caused by the error bits as a result of performing an error correction operation on the first ECC code word group is located in an ECC code word group, which is not pre-fetched, included in the ECC code word.

7. The method according to claim 1, wherein the semiconductor memory device is a stacked memory device in which a plurality of chips for transmitting and receiving data and control signals through a through-silicon-via (TSV) are stacked.

8. A method of correcting an error in a semiconductor memory device including a memory cell array which includes a plurality of memory cell groups each including a plurality of memory cells, the method comprising:
receiving first data from outside the semiconductor memory device;
generating first check bits based on the first data and a first parity generator matrix,
the first parity generator matrix including a plurality of columns of bits, the plurality of columns of bits being arranged in a plurality of parity generator matrix groups; and
storing an error correcting code (ECC) code word including a plurality of ECC code word groups and the first check bits, each ECC code word group having a plurality of ECC code word sub groups, the plurality of ECC code word groups corresponding to the plurality of parity generator matrix groups, respectively,
wherein, for each parity generator matrix group of the first parity generator matrix, a result value of a bit-by-bit exclusive OR (XOR) operation performed on any two columns included in the parity generator matrix group is equal to a column number of a column, from among the plurality of columns of bits, that is not included in the parity generator matrix group such that,
when a first ECC code word sub group of a first ECC code word group, from among the plurality of ECC code word groups, includes error bits, a miscorrected bit that would be caused by the error bits as a result of performing an error correction operation on the first ECC code word group is located in an ECC code word group other than the first ECC code word group.

9. The method according to claim 8, wherein the first parity generator matrix is configured such that, if the error bits exist in the first ECC code word sub group and a second ECC code word sub group of the first ECC code word group, a miscorrected bit that would be caused by the error bits as a result of performing an error correction operation on the first ECC code word group is located in an ECC code word group other than the first ECC code word group.

10. The method according to claim 8, wherein the first parity generator matrix is configured such that, if an error detection and correction capability of the ECC code word is one error bit, and two error bits exist in the first ECC code word group, a miscorrected bit that would be caused by the two error bits as a result of performing an error correction operation on the first ECC code word group is located in an ECC code word group other than the first ECC code word group.

11. The method according to claim 8, wherein the first parity generator matrix is configured such that, if an error detection and correction capability of the ECC code word is k error bits, and k+1 error bits exist in the first ECC code word group, a miscorrected bit that would be caused by the k+1 error bits as a result of performing an error correction operation on the first ECC code word group is located in an ECC code word group other than the first ECC code word group.

12. The method according to claim 8, wherein each of the ECC code word groups has 16 bits or 32 bits.

13. The method according to claim 8, wherein the first parity generator matrix is configured such that, if a size of the ECC code word is greater than that of a pre-fetch unit, the miscorrected bit that would be caused by the error bits as a result of performing an error correction operation on the first ECC code word group is located in an ECC code word group, which is not pre-fetched, included in the ECC code word.

14. The method according to claim 8, wherein the semiconductor memory device is a stacked memory device in which a plurality of chips for transmitting and receiving data and control signals through a through-silicon-via (TSV) are stacked.

15. A semiconductor memory device comprising:
an encoder configured to,
generate first check bits based on received data received from a host and a first parity generator matrix, the first parity generator matrix including a plurality of columns of bits, the plurality of columns of bits being arranged in a plurality of parity generator matrix groups,
form an error correcting code (ECC) code word including the received data and the first check bits, and
divide the ECC code word into a plurality of ECC code word groups, the plurality of ECC code word groups corresponding to the plurality of parity generator matrix groups, respectively;
a memory cell array including a plurality of memory cell groups having a plurality of memory cells, and configured to store the ECC code word; and
a decoder configured to,
decode and correct read data received from the memory cell array based on second check bits received from the memory cell array, and output the corrected read data,
wherein, for each parity generator matrix group of the first parity generator matrix, a result value of a bit-by-bit exclusive OR (XOR) operation performed on any two columns included in the parity generator matrix group is equal to a column number of a column, from among the plurality of columns of bits, that is not included in the parity generator matrix group such that, when a first ECC code word group, from among the plurality of ECC code word groups, includes error bits, a miscorrected bit that would be caused by the error bits as a result of performing an error correction operation on the first ECC code word group is located in an ECC code word group other than the first ECC code word group.

16. The semiconductor memory device according to claim 15, the first parity generator matrix is configured such that, if an error detection and correction capability of the semiconductor memory device is one error bit, and two error bits exist in the first ECC code word group, a miscorrected bit that would be caused by the two error bits as a result of performing an error correction operation on the first ECC code word group is located in an ECC code word group other than the first ECC code word group.

17. The semiconductor memory device according to claim 15, the first parity generator matrix is configured such that, if an error detection and correction capability of the semiconductor memory device is k error bits, and k+1 error bits exist in the first ECC code word group, a miscorrected bit that would be caused by the k+1 error bits as a result of performing an error correction operation on the first ECC code word group is located in an ECC code word group other than the first ECC code word group.

18. The semiconductor memory device according to claim 15, wherein each of the ECC code word groups of the plurality of ECC code word groups has 16 bits or 32 bits.

19. The semiconductor memory device according to claim 15, wherein the first parity generator matrix is configured such that, if a size of the ECC code word is greater than that of a pre-fetch unit, the miscorrected bit that would be caused by the error bits as a result of performing an error correction operation on the first ECC code word group is located in an ECC code word group, which is not pre-fetched, included in the ECC code word.

20. The semiconductor memory device according to claim 15, wherein the semiconductor memory device is a stacked memory device in which a plurality of chips for transmitting and receiving data and control signals through a through-silicon-via (TSV) are stacked.

* * * * *